United States Patent
Li Puma et al.

(10) Patent No.: US 9,565,043 B1
(45) Date of Patent: Feb. 7, 2017

(54) HYBRID I-Q POLAR TRANSMITTER WITH QUADRATURE LOCAL OSCILLATOR (LO) PHASE CORRECTION

(71) Applicant: Intel IP Corporation, Santa Clara, CA (US)

(72) Inventors: Giuseppe Li Puma, Bochum (DE); Victor Da Fonte Dias, Neubiberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/071,867

(22) Filed: Mar. 16, 2016

(51) Int. Cl.
*H04L 27/00* (2006.01)
*H04L 27/20* (2006.01)
*H04B 1/04* (2006.01)

(52) U.S. Cl.
CPC ............. *H04L 27/2032* (2013.01); *H04B 1/04* (2013.01)

(58) Field of Classification Search
CPC ............... H04B 1/0483; H04B 2001/0491; H04B 1/0003; H04B 2201/70716; H04B 1/04; H03C 2200/0058; H04L 27/20; H04L 27/3488; H04L 27/364; H04L 27/183; H04L 27/36; H04L 27/2032; H03M 1/66; H03M 1/007; H03M 1/74; H03M 1/0639; H03M 1/201; H03M 1/20; H03M 3/412
USPC ................................. 375/260, 295; 341/144
See application file for complete search history.

(56) References Cited

U.S. PATENT DOCUMENTS 6,259,747 B1    7/2001  Gustafsson et al.
8,378,870 B1 *  2/2013  Matsuura ............ H03M 1/0665
                                                        341/144

OTHER PUBLICATIONS

Zimmermann, Niklas. "Design and Implementation of a Broadband RF-DAC Transmitter for Wireless Communications." Jul. 1, 2011. 151 pages.
Nash, Eamon. "Correcting Imperfections in IQ Modulators to improve RF Signal Fidelity." Analog Devices, AN-1039 Application Note. www.analog.com. 8 pages.
Bercher, J.-F., et al. "Adaptive delays alignment in polar transmitter architecture." 9 pages.
"Sources of Error in IQ Based RF Signal Generation." Jan. 9, 2007, www.ni.com. 8 pages.
U.S. Appl. No. 14/861,005, filed Sep. 22, 2015.
Notice of Allowance Dated Apr. 25, 2016 U.S. Appl. No. 14/861,005.

* cited by examiner

Primary Examiner — Rahel Guarino
(74) Attorney, Agent, or Firm — Eschweiler & Associates, LLC

(57) ABSTRACT

A hybrid polar I-Q transmitter comprises an I-Q quantization circuit configured to receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC). Each of the first and second I-Q data pairs corresponds to a point in an I-Q constellation diagram comprising an I axis and a Q axis that are orthogonal to one another. The transmitter further comprises a quantization reduction circuit configured to determine a first rotation angle and a second rotation angle of the I-axis and Q-axis, respectively, based on the first I-Q data pair and the second I-Q data pair, and use the determined first rotation angle and the second rotation angle for generating an RF output signal.

20 Claims, 4 Drawing Sheets

HYBRID I-Q POLAR TRANSMITTER WITH QUADRATURE LOCAL OSCILLATOR (LO) PHASE CORRECTION

FIELD

The present disclosure relates to I-Q transmitters and, in particular to an apparatus and a method for reducing a resolution of digital to analog converters (DAC) in I-Q transmitters.

BACKGROUND

Since new applications and upcoming standards require increasing data rates and lower power consumption, the study and development of new architectures of communication transmitters for user units is very active. The in-phase and quadrature modulator (IQ modulator) is a key component in modern wireless transmitters. I-Q up conversion is one of the architectures of choice for implementing transmitter signal chains for end applications such as cellular, WiMAX, and wireless point-to-point. It provides a convenient method for modulating data bits or symbols onto an RF carrier.

In a typical wireless transmitter that uses I-Q modulation, an input data comprises an in-phase component and a quadrature component. The I-Q transmitter comprises a DAC, for example an RFDAC that convert the in-phase and the quadrature components to a pair of I and Q output signals. RFDACs directly convert a digital baseband signal into an RF output signal, by using a building block which combines digital-to-analog conversion and up conversion mixing. High-performance digital-to-analog converters with high resolution can provide the flexibility needed to support multiple frequency bands and multiple standards in modern wireless communication transmitters. For cellular applications such as WCDMA or LTE, the required resolution of DACs is typically in the range of 15 bits. However, the high resolution DACs lead to higher power dissipation.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
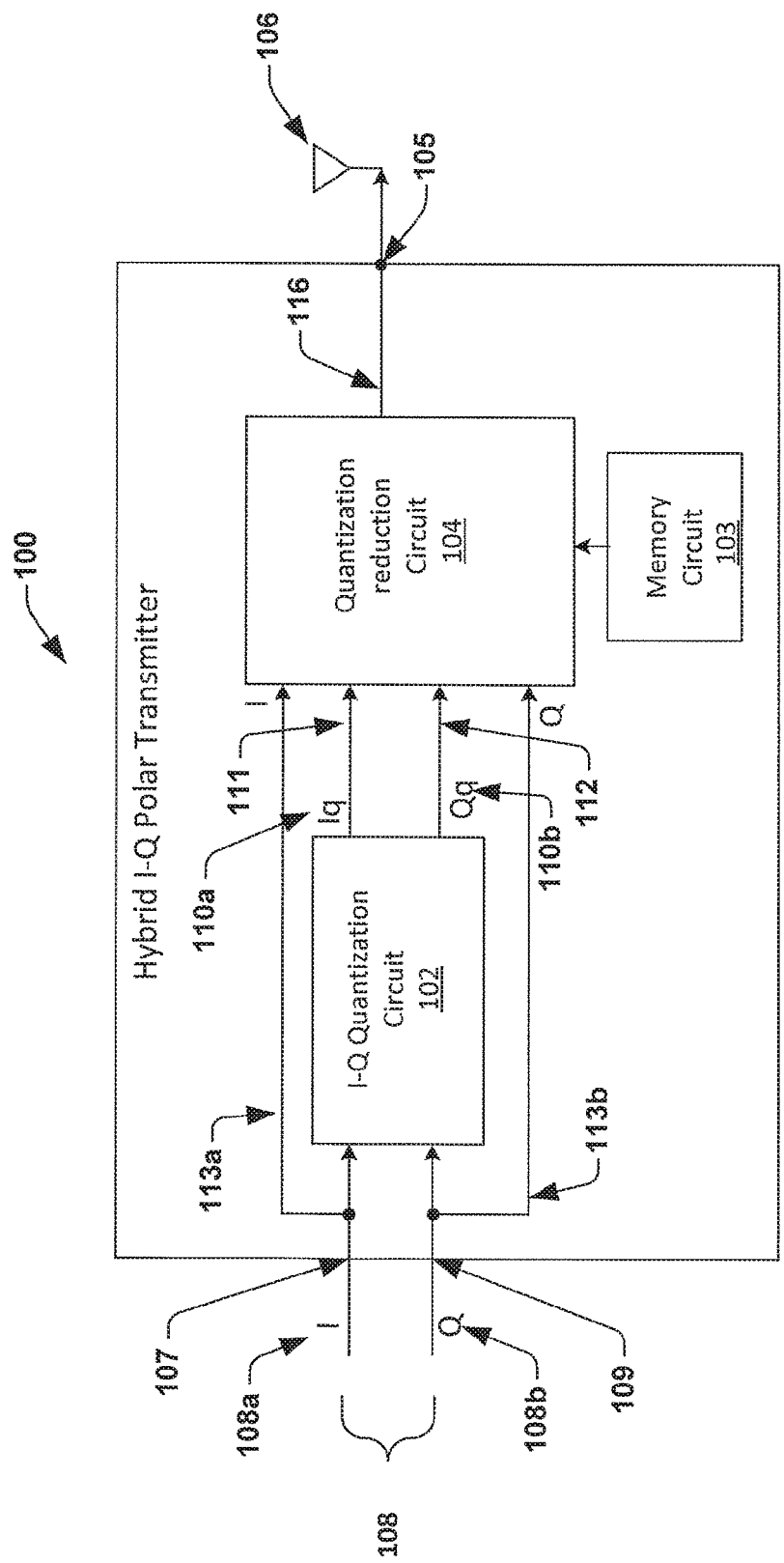
FIG. 1 depicts a simplified block diagram of a hybrid I-Q polar transmitter, according to one embodiment of the disclosure.

In one embodiment of the disclosure, a hybrid I-Q polar transmitter is disclosed. The hybrid I-Q polar transmitter comprises an I-Q quantization circuit configured to receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC) in a signal path of the quantized in-phase and quadrature signals, wherein the first and second I-Q data pairs form an I-Q constellation point. The hybrid I-Q polar transmitter further comprises a quantization reduction circuit to minimize a quantization error associated with the DAC, coupled to the I-Q quantization circuit and configured to determine a first rotation angle and a second rotation angle based on the first I-Q data pair and the second I-Q data pair; and use the first rotation angle and the second rotation angle in generating a radio frequency (RF) output signal.

In another embodiment of the disclosure, a hybrid I-Q polar transmitter is disclosed. The hybrid I-Q polar transmitter comprises a quantization circuit configured to receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC) in a signal path of the quantized in-phase and quadrature signals. Each of the first and the second I-Q data pairs corresponds to a point in an I-Q constellation diagram comprising an I-axis and a Q-axis that are orthogonal to one another. The hybrid I-Q polar transmitter further comprises a phase correction circuit coupled to the quantization circuit and configured to determine a first rotation angle corresponding to an angle by which the I-axis is rotated to form a derived I-axis based on the first I-Q data pair and the second I-Q data pair, and determine a second rotation angle corresponding to an angle by which the Q-axis is rotated to form a derived Q-axis based on the first I-Q data pair and the second I-Q data pair, wherein the I-axis and the Q-axis are rotated to minimize a quantization error associated with the DAC. Furthermore, the hybrid I-Q polar transmitter comprises a synthesizer circuit configured to generate a first phase corrected local oscillator (LO) signal with an added first correction phase, wherein the first correction phase corresponds to the determined first rotation angle; and generate a second phase corrected local oscillator (LO) signal with an added second correction phase, wherein the second correction phase corresponds to the determined second rotation angle. In addition, the hybrid I-Q polar transmitter comprises a modulation circuit configured to up convert the quantized in-phase signal based on the first phase corrected LO signal, and up convert the quantized quadrature signal based on the second phase corrected LO signal.

In another embodiment of the disclosure, a method for a hybrid I-Q polar transmitter is disclosed. The method comprises receiving an in-phase signal and a quadrature signal forming a first I-Q data pair, and generating a quantized in-phase signal and a quantized quadrature signal forming a second I-Q data pair, respectively, based thereon using a quantization circuit, wherein each of the first and the second I-Q data pairs corresponds to a point in an I-Q constellation diagram comprising an I-axis and a Q-axis that are orthogonal to one another. The method further comprises determining a first rotation angle corresponding to an angle by which the I-axis is rotated to form a derived I-axis and determining a second rotation angle corresponding to an angle by which the Q-axis is rotated to form a derived Q-axis based on the first I-Q data pair and the second I-Q data pair, using a phase correction circuit. Furthermore, the method comprises generating a first phase corrected local oscillator (LO) signal with an added first correction phase, based on the determined first rotation angle and generating a second phase corrected local oscillator (LO) signal with an added second correction phase, based on the determined second rotation angle using a synthesizer circuit; and up converting the quantized in-phase signal and the quantized quadrature signal based on the first phase corrected LO signal and the second phase corrected LO signal, respectively, using a modulation circuit.

The present disclosure will now be described with reference to the attached drawing figures, wherein like reference numerals are used to refer to like elements throughout, and wherein the illustrated structures and devices are not necessarily drawn to scale. As utilized herein, terms "module", "component," "system," "circuit," "element," "slice," and the like are intended to refer to a computer-related entity, hardware, software (e.g., in execution), and/or firmware. For example, a circuit or similar term can be a processor, a process running on a processor, a controller, an object, an executable program, a storage device, and/or a computer with a processing device. By way of illustration, an application running on a server and the server can also be a circuit. One or more circuits can reside within a process, and a circuit can be localized on one computer and/or distributed between two or more computers. A set of elements or a set of other circuits can be described herein, in which the term "set" can be interpreted as "one or more."

As another example, a circuit or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a circuit can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, high-performance digital-to-analog converters with high resolution can provide the flexibility needed to support multiple frequency bands and multiple standards in modern wireless communication transmitters. In a typical I-Q transmitter, a single data signal is split into an in-phase component I and a quadrature component Q. The in-phase component I and a quadrature component Q have an infinitesimal resolution which in practice can be accomplished by increasing a word length of the signal. In conventional I-Q transmitters, in order to support high word lengths, high resolution DACs are required. DACs have quantization error associated therewith which can be modelled as a quantization noise. The quantization noise greatly reduces with an increase in DAC resolution. High resolution DACs, however, consume higher power and also have increased area requirements. In this disclosure, an architecture and a method to reduce DAC resolution in I-Q transmitters is proposed. In particular, an architecture of a hybrid I-Q polar transmitter that supports high data rates and lower noise floor using a lower resolution DAC is presented. For example, the hybrid I-Q polar transmitter disclosed herein enables to achieve the benefits of a higher resolution DAC using a lower resolution DAC.

In the following description, examples will be described and explained in more detail with respect to reducing DAC resolution in I-Q transmitters. In particular, in one embodiment, a hybrid I-Q polar transmitter with quadrature LO phase correction that enables to reduce the DAC resolution is described.

FIG. 1 depicts a simplified block diagram of a hybrid I-Q polar transmitter 100, according to one embodiment of the disclosure. In some embodiments, the hybrid I-Q polar transmitter 100 is included in the transmit path of a transceiver in wireless communication systems. The hybrid I-Q polar transmitter 100 comprises an I-Q quantization circuit 102, a quantization reduction circuit 104 and an antenna port 105.

In some embodiments, the quantization reduction circuit 104 can be a part of a radio frequency (RF) front end of the hybrid I-Q polar transmitter 100. The I-Q quantization circuit 102 is configured to receive an in-phase signal I 108a at a first input 107 and a quadrature signal Q 108b at a second input 109 and generate a quantized in-phase signal Iq 110a and a quantized quadrature signal Qq 110b, based thereon. In some embodiments, the quantized in-phase signal Iq 110a and the quantized quadrature signal Qq 110b are generated based on information of a resolution of a digital to analog converter (DAC) in a signal path of the quantized in-phase signal Iq 110a and the quantized quadrature signal Qq 110b.

In some embodiments, the quantized in-phase signal Iq 110a and the quantized quadrature signal Qq 110b leads to quantization errors in the hybrid I-Q polar transmitter 100 due to a limited resolution of the DAC. In some embodiments, the DAC is a part of the quantization reduction circuit 104. Further, the hybrid I-Q polar transmitter 100 comprises a memory circuit 103 coupled to the quantization reduction circuit 104. In some embodiments, the in-phase and quadrature signals I 108a and Q 108b comprise a first I-Q data pair (I,Q), and the quantized in-phase and the quantized quadrature signals Iq 110a and Qq 110b, comprise a second I-Q data pair ($I_q, Q_q$). In some embodiments, each of the first and the second I-Q data pairs corresponds to a point respectively, in an I-Q constellation diagram comprising an I-axis and a Q-axis that are orthogonal to one another.

The hybrid I-Q polar transmitter 100 further comprises a first signal path 111, a second signal path 112 configured to convey the quantized in-phase signal Iq 110a, the quantized quadrature signal Qq 110b from the I-Q quantization circuit 102 to the quantization reduction circuit 104. In addition, the hybrid I-Q polar transmitter 100 further comprises a third signal path 113a and a fourth signal path 113b configured to convey the in-phase signal I 108a and the quadrature signal Q 108b to the quantization reduction circuit 104. The quantization reduction circuit 104 is located downstream of the I-Q quantization circuit 102 and is configured to determine a first rotation angle to be applied to the quantized in-phase signal Iq 110a and a second rotation angle to be applied to the quantized quadrature signal Qq 110b. In some embodiments, the first rotation angle and the second rotation angle are determined by a phase correction circuit (not shown) within the quantization reduction circuit. In some embodiments, the first rotation angle corresponds to an angle by which the I-axis in the I-Q constellation diagram is rotated to form a derived I-axis and the second rotation angle corresponds to an angle by which the Q-axis in the I-Q constellation diagram is rotated to form a derived Q-axis, in order to minimize a quantization error associated with the DAC. Reduction of the quantization error based on rotation of the I-axis and the Q-axis will be explained in further detail in the embodiments below.

In some embodiments, rotating the quantized in-phase signal Iq 110a and the quantized quadrature signal Qq 110b is achieved by up converting the quantized in-phase signal Iq 110a and the quantized quadrature signal Qq 110b based on phase compensated local oscillator signals. To achieve this functionality, in some embodiments, quantization reduction circuit 104 comprises a synthesizer circuit (not shown) configured to generate the phase compensated LO signals based on the determined first rotation angle and the second rotation angle. In some embodiments, the quantization reduction circuit 104 further comprises a DAC, the resolution information of which is used in generating the quantized in-phase signal Iq 110a and the quantized quadrature signal Qq 110b in the I-Q quantization circuit 102. Further, in some embodiments, the quantization reduction circuit 104 comprises a mixer circuit (not shown) configured to up convert the quantized in-phase signal Iq 110a and the quantized quadrature signal Qq 110b in the I-Q quantization circuit 102 to form an output signal 116 at RF frequency, based on the phase compensated LO signals. In some embodiments, the output signal 116 is formed by a summation of the up converted quantized in-phase signal and the up converted quantized quadrature signal in a summation circuit (not shown) within the quantization reduction circuit 104. In some embodiments, the output signal 116 is conveyed to an antenna 106 via the antenna port 105.

Figure 2:
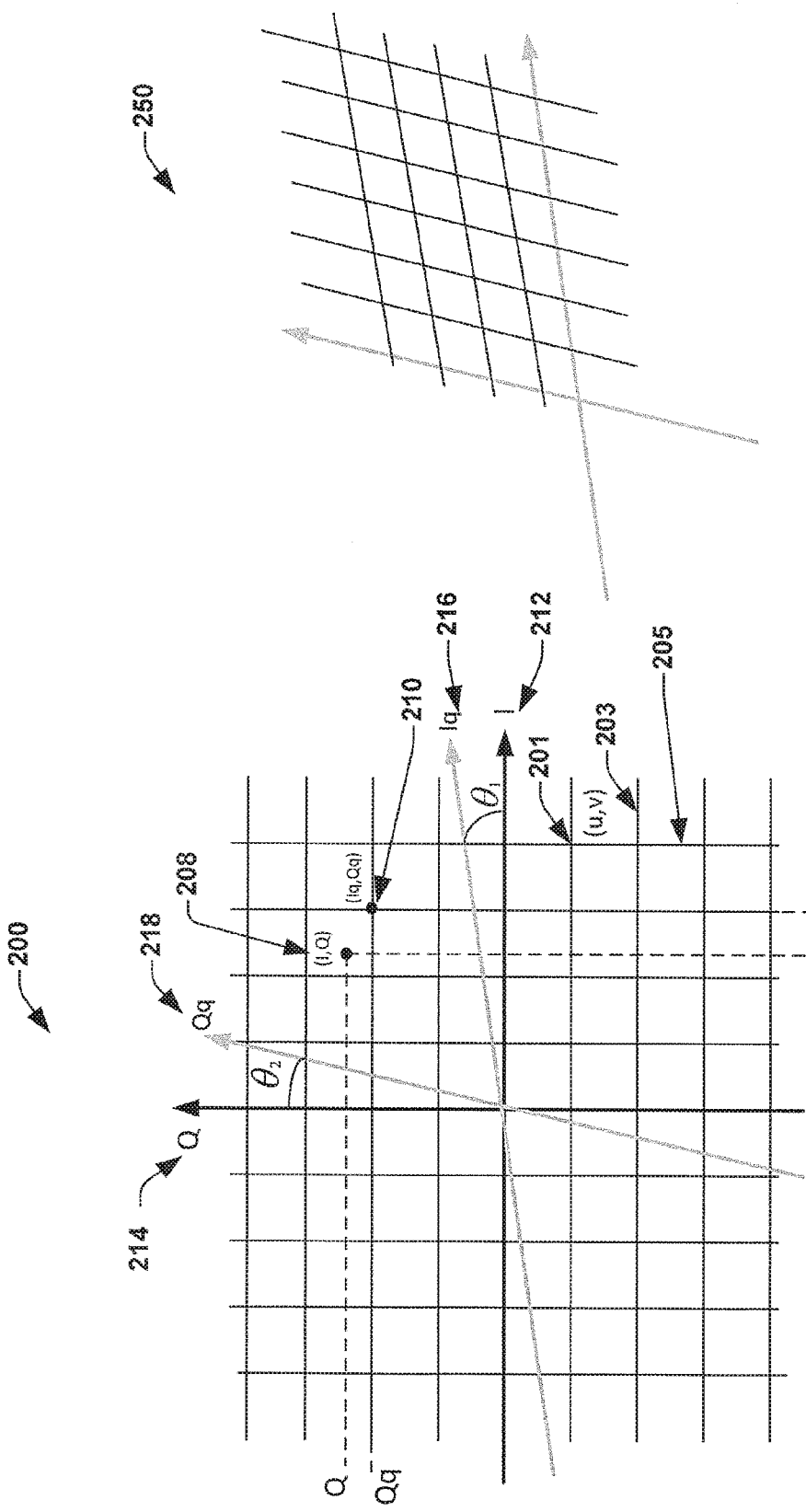
FIG. 2a depicts an I-Q constellation diagram comprising an I-axis and a Q-axis that are orthogonal to one another, according to one embodiment of the disclosure.
FIG. 2b depicts an I-Q constellation diagram comprising an I-axis and a Q-axis that are not orthogonal to one another, according to one embodiment of the disclosure.

FIG. 2a depicts an I-Q constellation diagram 200 comprising an I-axis 212 and a Q-axis 214 that are orthogonal to one another, according to one embodiment of the disclosure. The basic idea of this disclosure can be illustrated based on the I-Q constellation diagram 200 with reference to FIG. 1. The I-Q constellation diagram 200 comprises a predefined set of constellation points (u,v) 201, visualized by the intersections of the horizontal grid lines 203 and the vertical grid lines 205. The location of the predefined set of constellation points (u,v) 201 are determined based on a resolution of a DAC, for example the DAC in the quantization reduction circuit 104 in FIG. 1. The discrete set of constellation points (u,v) 201 represents the values that can be obtained due to the quantization of the DAC in the two-dimensional space 200 (i.e., the co-domain or value-range of the DAC). Let the first I-Q data pair (I,Q) (i.e., the desired input signal) in FIG. 1 corresponding to the in-phase signal I 108a and the quadrature signal Q 108b be defined by a point 208 (I,Q) in the constellation diagram 200.

Due to the limited resolution of the DAC, the in-phase signal I 108a and the quadrature signal Q 108b are quantized to form the quantized in-phase signal Iq 110a and the quantized quadrature signal Qq 110b, comprising the second I-Q data pair (Iq,Qq). In some embodiments, the second I-Q data pair (Iq,Qq) is defined by a nearest constellation point, for example, the constellation point 210 (Iq,Qq) in FIG. 2a. The quantization of the in-phase signal I 108a and the quadrature signal Q 108b leads to quantization errors in hybrid I-Q polar transmitter 100 in FIG. 1. To reduce the quantization error, the constellation point that defines the quantized signals, for example, the constellation point 210 should lie closer to the desired input signal, that is, the first I-Q data pair (I,Q) 208 in order to reconstruct the desired signal. In order to achieve this, in this embodiment, the I-axis 212 and the Q-axis 214 are rotated to form a derived I-axis 216 and a derived Q-axis 218, respectively. In some embodiments, rotating the I-axis 212 and the Q-axis 214 is equivalent to providing a complex rotation to the quantized in-phase signal Iq 110a and the quantized quadrature signal Qq 110b (e.g., the constellation point 208) so as to reconstruct the desired input signal, that is, the first I-Q data pair (I,Q) 208. In some embodiments, the derived I-axis 216 and a derived Q-axis 218 are not orthogonal to one another.

The rotation of the I-axis 212 and the Q-axis 214 defines a new set of constellation points, as can be seen in the constellation diagram 250 in FIG. 2b. In some embodiments, this rotation enables to focus the resolution of the DAC in a given area, exactly where it is required for a particular input signal. Therefore, in this embodiment, this rotation enables the second I-Q data pair (Iq,Qq) 210 to lie closer to the desired first I-Q data pair (I,Q) 208 and thus reduce the quantization error in the hybrid I-Q polar transmitter 100. In other words, the quantized in-phase signal Iq 110a and the quantized quadrature signal Qq 110b are given a complex rotation in order to reconstruct the desired input signal, that is, the in-phase signal I 108a and the quadrature signal Q 108b. In some embodiments, the I-axis 212 is rotated by a first rotation angle $\theta_1$ to form the derived I-axis 216 and the Q-axis 214 is rotated by a second rotation angle $\theta_2$ to form the derived Q-axis 218. In some embodiments, rotating the I-axis 212 and the Q-axis 214 is equivalent to applying the first rotation angle $\theta_1$ to the quantized in-phase signal Iq 110a and applying the second rotation angle $\theta_2$ to the quantized quadrature signal Qq 110b, respectively. In some embodiments, the derived I-axis 216 and the derived Q-axis 218 defines the quantized in-phase signal Iq 110a and the quantized quadrature signal Qq 110b, with the complex rotation applied. In some embodiments, the first rotation angle $\theta_1$ and the second rotation angle $\theta_2$ are different. In some embodiments, the derived I-axis 216 and the derived Q-axis 218 are not orthogonal to one another.

In order to determine the first rotation angle $\theta_1$ and the second rotation angle $\theta_2$, a complex phasor I+jQ representing the desired input signal, that is, the first I-Q data pair (I,Q) 208 in FIG. 2a, is written in terms of the quantized in-phase signal Iq 110a and the quantized quadrature signal Qq 110b with the complex rotation applied (i.e., with respect to the derived I-axis 216 and the derived Q-axis 218), as given below:

$$(I_q \cos(\theta 1) - Q_q \sin(\theta 2)) + J(I_q \sin(\theta 1) + Q_q \cos(\theta 2)) \quad (1)$$

where Iq and Qq are the quantized signals of the in-phase and quadrature signals I and Q, and $\theta_1$ and $\theta_2$ are the corresponding rotation applied to the quantized signals Iq and Qq.

This leads to the system of equations given below:

$$I = I_q \cos(\theta 1) - Q_q \sin(\theta 2) \quad (2)$$

$$Q = I_q \sin(\theta 1) + Q_q \cos(\theta 2) \quad (3)$$

One way to solve the set of equations (2) and (3) is use the approximation for sin(x) and cos(x). In this exemplary case, the first rotation angle $\theta_1$ and the second rotation angle $\theta_2$ can be derived as follows:

$$\begin{bmatrix} \theta 1 \\ \theta 2 \end{bmatrix} = \begin{bmatrix} -\frac{(I - Iq) - (Q - Qq)}{2Iq} \\ -\frac{(I - Iq) + (Q - Qq)}{2Qq} \end{bmatrix} \quad (4)$$

where I and Q are the in-phase and quadrature signals, and Iq and Qq are the quantized quadrature signals. For example, in this case, small angle approximation for $\theta_1$ and $\theta_2$ is used, which leads to sin $\theta \sim \theta$ and cos $\theta \sim (1-\theta)$. Using other approximations, for example, $$\cos\theta = 1 - \frac{x^2}{2},$$

could lead to other solutions. In some embodiments, $\theta_1$ and $\theta_2$ are determined based on equation (4), using the phase correction circuit within the quantization reduction circuit 104 in FIG. 1. In some embodiments, the phase correction circuit can be a processor executing instructions or a hardware entity, for example, an electric circuitry or an apparatus that provides specific functionality through electronic components.

Figure 3:
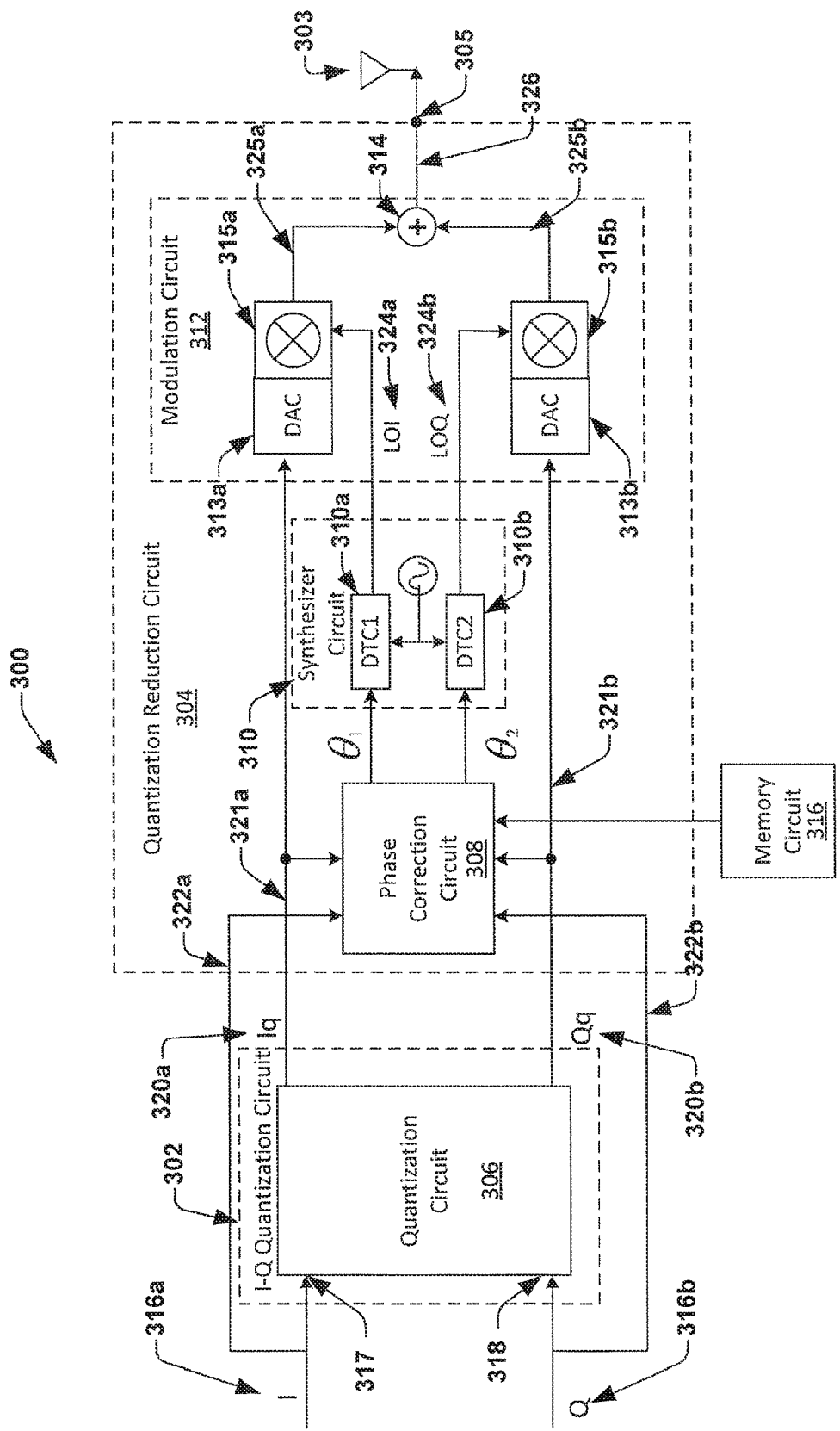
FIG. 3 depicts an example implementation of a hybrid I-Q polar transmitter, according to one embodiment of the disclosure.

FIG. 3 depicts an example implementation of a hybrid I-Q polar transmitter 300, according to one embodiment of the disclosure. The hybrid I-Q polar transmitter 300 comprises an I-Q quantization circuit 302, a quantization reduction circuit 304 and an antenna port 305. In some embodiments, the quantization reduction circuit 304 can be a part of radio frequency (RF) front end of the hybrid I-Q polar transmitter 300. The I-Q quantization circuit 302 comprises a quantization circuit 306 configured to receive an in-phase signal I 316a at a first input 317 and a quadrature signal Q 316b at a second input 318, corresponding to the first I-Q data pair (I,Q) 208 in FIG. 2a and generate a quantized in-phase signal Iq 320a and a quantized quadrature signal Qq 320b, corresponding to the second I-Q data pair (Iq,Qq) 210 in FIG. 2a, based thereon. Generation of the quantized in-phase signal Iq 320a and the quantized quadrature signal Qq 320b is performed by choosing a constellation point from a predefined set of constellation points, as explained above with respect to FIG. 2a. In some embodiments, the predefined set of constellation points is a function of a resolution of a DAC in a signal path of the quantized in-phase signal Iq 320a and the quantized quadrature signal Qq 320b.

The hybrid I-Q polar transmitter 300 further comprises a first signal path 321a and a second signal path 321b configured to convey the quantized in-phase signal Iq 320a and the quantized quadrature signal Qq 320b, respectively, from the I-Q quantization circuit 302 to the quantization reduction circuit 304. The quantization reduction circuit 304 is located downstream of the I-Q quantization circuit 302 and comprises a phase correction circuit 308, a synthesizer circuit 310 and a modulation circuit 312. The phase correction circuit 308 is configured to receive the in-phase signal 322a, the quadrature signal 322b, the quantized in-phase signal 321a and the quantized quadrature signal 321b and generate a first rotation angle θ1 and a second rotation angle θ2 to be applied to the quantized in-phase signal 321a and the quantized quadrature signal 321b, respectively, based thereon. In some embodiments, the first rotation angle θ1 and the second rotation angle θ2 are determined based on the equation (4) above. In some embodiments, the hybrid I-Q polar transmitter 300 further comprises a memory circuit 316 configured to store the instructions required to implement the equation (4) above via a processor. In some implementations, the memory circuit 316 comprises digital logic to implement the instructions, memory, firmware etc. The memory circuit 316 is coupled to the quantization reduction circuit 304 and in some implementations, the memory circuit 316 could be a part of the quantization reduction circuit 304.

The synthesizer circuit 310 is located downstream of the phase correction circuit 308 and is configured to generate the LO signals LOI 324a and LOQ 324b. In some embodiments, the synthesizer circuit 310 is configured to receive the first rotation angle θ1 and the second rotation angle θ2 from the phase correction circuit 308 and generate the first signal LOI 324a and the second LO signal LOQ 324b, respectively, based thereon, with a correction phase added thereto. In some embodiments, the first signal LOI 324a is a phase compensated LO signal with a first phase correction added thereto, corresponding to the first rotation angle θ1 and the second signal LOQ 324b is a phase compensated LO signal with a second phase correction added thereto, corresponding to the second rotation angle θ2. In some embodiments, the synthesizer circuit 320 comprises an LO generation circuit with phase/frequency modulation capability. In some implementations, the synthesizer 320 with phase/frequency modulation capability is realized by using a first digital-to-time converter (DTC) circuit DTC1 310a configured to generate the first signal LOI 324a and a second DTC circuit 310b is configured to generate the second signal LOQ 324b.

The modulation circuit 312 is located downstream of the synthesizer circuit 310 and is configured to up convert the quantized in-phase signal Iq 320a in the first signal path 321a and the quantized quadrature signal Qq 320b in the second signal path 321b, based on the LO signals LOI 324a and LOQ 324b, respectively. The modulation circuit 312 comprises a first DAC 313a, a first mixer circuit 315a, a second DAC 313b and a second mixer circuit 315b. In some embodiments, the first DAC 313a and the first mixer circuit 315a are combined to form a first RFDAC and the second DAC 313b and the second mixer circuit 315b are combined to form a second RFDAC. A resolution information of the first DAC 313a and the second DAC 313b are utilized to generate the predefined set of constellation points in the constellation diagram 200, as explained above with respect to FIG. 2a.

The first DAC 313a is located downstream of the first signal path 321a and is configured to convert the quantized in-phase signal Iq 320a to an analog I signal. The first mixer circuit 315a is located downstream of the first DAC 313a and is configured to up convert the analog I signal to a first RF output signal 325a based on the first local oscillator (LO) signal LOI 324a. Similarly, the second DAC 313b is located downstream of the second signal path 321b and is configured to convert the quantized quadrature signal $Q_q$ 320b to an analog Q signal. The second mixer circuit 315b is located downstream of the second DAC 313b and is configured to up convert the analog Q signal to a second RF output signal 325b based on a second LO signal LOQ 324b. The modulation circuit 312 further comprises a summation circuit 314 configured to receive the first RF output signal 325a and the second RF output signal 325b, and generate a compensated RF output signal 326 based thereon. The compensated RF output signal 326 is then transmitted to the antenna 303 via the antenna port 305.

Figure 4:
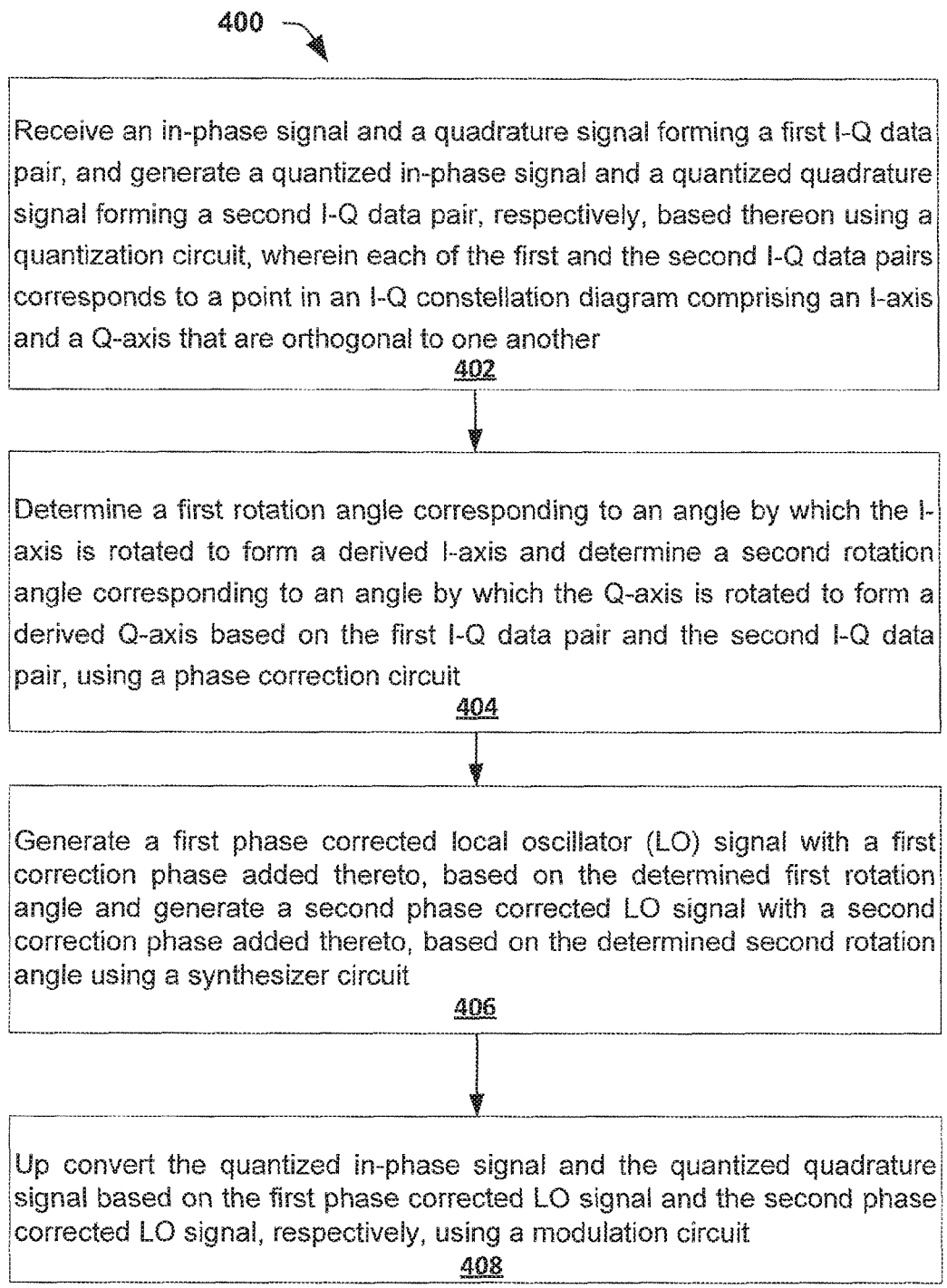
FIG. 4 shows a flowchart of a method for a hybrid I-Q polar transmitter, according to one embodiment of the disclosure.

FIG. 4 shows a flowchart of a method 400 for a hybrid I-Q polar transmitter, according to one embodiment of the disclosure. The method 400 is described herein with respect to the hybrid I-Q polar transmitter 300 of FIG. 3 and the constellation diagram 200 of FIG. 2a. At 402, an in-phase signal I 316a and a quadrature signal Q 316b comprising a first I-Q data pair is received at an input of the quantization circuit 306 and a quantized in-phase signal Iq 320a and a quantized quadrature signal Qq 320b comprising a second I-Q data pair is generated based thereon. Generating the quantized in-phase signal Iq 320a and the quantized quadrature signal Qq 320b comprises choosing a nearest constellation point to the first I-Q data pair, for example, the constellation point 210 corresponding to the second I-Q pair from a predefined set of constellation points in the I-Q constellation diagram 200 in FIG. 2a. At 404, a first rotation angle θ1 and a second rotation angle θ2 to be applied to the quantized in-phase signal Iq 320a and the quantized quadrature signal Qq 320b, respectively, is determined at the phase correction circuit 308 based on equation (4) above. At 406, a first phase corrected local oscillator (LO) signal LOI 324a with a first correction phase added thereto is generated based on the determined first rotation angle θ1 and a second phase corrected LO signal LOQ 324b with a second correction phase added thereto is generated based on the determined second rotation angle θ2, using the synthesizer circuit 310. At 408, the quantized in-phase signal Iq 320a and the quantized quadrature signal Qq 320b is up converted based on the first phase corrected LO signal LOI 324a and the second phase corrected LO signal LOQ 324b, respectively, using the modulation circuit 312. In some embodiments, this method enables hybrid I-Q polar transmitters to achieve low noise floors using lower resolution DACs.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a hybrid polar I-Q transmitter, comprising an I-Q quantization circuit configured to receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC) in a signal path of the quantized in-phase and quadrature signals, wherein the first and second I-Q data pairs form an I-Q constellation point; and a quantization reduction circuit to minimize a quantization error associated with the DAC, coupled to the I-Q quantization circuit and configured to determine a first rotation angle and a second rotation angle based on the first I-Q data pair and the second I-Q data pair; and use the first rotation angle and the second rotation angle in generating a radio frequency (RF) output signal.

Example 2 is an I-Q transmitter including the subject matter of example 1, wherein the quantization reduction circuit further comprises a phase correction circuit coupled to the quantization circuit and configured to receive the in-phase signal, the quadrature signal, the quantized in-phase signal and the quantized quadrature signal; and determine the first rotation angle and the second rotation angle based thereon.

Example 3 is an I-Q transmitter including the subject matter of examples 1-2, including or omitting elements, wherein the first rotation angle and the second rotation angle are determined based on a first predetermined relation and a second predetermined relation, respectively, based on the in-phase signal, the quadrature signal, the quantized in-phase signal and the quantized quadrature signal.

Example 4 is an I-Q transmitter including the subject matter of examples 1-3, including or omitting elements, further comprising a memory circuit configured to store instructions to implement the first predetermined relation and the second predetermined relation.

Example 5 is an I-Q transmitter including the subject matter of examples 1-4, including or omitting elements, wherein the quantization reduction circuit further comprises a synthesizer circuit configured to receive the first rotation angle and the second rotation angle from the phase correction circuit; generate a first phase corrected local oscillator (LO) signal with a first correction phase added thereto, wherein the first correction phase corresponds to the first rotation angle; and generate a second phase corrected local oscillator (LO) signal with a second correction phase added thereto, wherein the second correction phase corresponds to the second rotation angle.

Example 6 is an I-Q transmitter including the subject matter of examples 1-5, including or omitting elements, wherein the synthesizer circuit further comprises a first digital-to-time converter (DTC) to generate the first phase corrected LO signal and a second DTC to generate the second phase corrected LO signal.

Example 7 is an I-Q transmitter including the subject matter of examples 1-6, including or omitting elements, wherein the quantization reduction circuit further comprises a first signal path and a second signal path configured to receive the quantized in-phase signal and the quantized quadrature signal, respectively, from the I-Q quantization circuit.

Example 8 is an I-Q transmitter including the subject matter of examples 1-7, including or omitting elements, wherein the quantization reduction circuit further comprises a modulation circuit configured to apply the first rotation corresponding to the first rotation angle to the quantized in-phase signal and apply the second rotation corresponding to the second rotation angle to the quantized quadrature signal.

Example 9 is an I-Q transmitter including the subject matter of examples 1-8, including or omitting elements, wherein the modulation circuit further comprises, the DAC, the resolution information of which is used in the I-Q derivation circuit to generate the first and second I-Q derived data components, wherein the DAC comprises a first DAC component located downstream of the first signal path and configured to receive and process the quantized in-phase signal, and a second DAC component located downstream of the second signal path and configured to receive and process the quantized quadrature signal.

Example 10 is an I-Q transmitter including the subject matter of examples 1-9, including or omitting elements, wherein the modulation circuit further comprises, a first mixer circuit configured to up convert the processed quantized in-phase signal from the first DAC component based on the first phase corrected LO signal, and a second mixer circuit configured to up convert the processed quantized quadrature signal from the second DAC component based on the second phase corrected LO signal.

Example 11 is an I-Q transmitter including the subject matter of examples 1-10, including or omitting elements, wherein the I-Q quantization circuit is configured to generate the quantized in-phase signal and the quantized quadrature signal by choosing a constellation point corresponding to the second I-Q pair from a predefined set of constellation points in the I-Q constellation diagram defined based on the resolution information of the DAC in the signal path of the quantized in-phase and quadrature signals.

Example 12 is a hybrid polar I-Q transmitter comprising a quantization circuit configured to receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC) in a signal path of the quantized in-phase and quadrature signals; wherein the first and the second I-Q data pairs form a point in an I-Q constellation diagram, and a phase correction circuit to minimize a quantization error associated with the DAC, coupled to the quantization circuit and configured to determine a first rotation angle based on the first I-Q data pair and the second I-Q data pair, and determine a second rotation angle based on the first I-Q data pair and the second I-Q data pair; a synthesizer circuit configured to generate a first phase corrected local oscillator (LO) signal with a first correction phase added thereto, wherein the first correction phase corresponds to the determined first rotation angle; and generate a second phase corrected local oscillator (LO) signal with a second correction phase added thereto, wherein the second correction phase corresponds to the determined second rotation angle; and a modulation circuit configured to up convert the quantized in-phase signal based on the first phase corrected LO signal, and up convert the quantized quadrature signal based on the second phase corrected LO signal.

Example 13 is an I-Q transmitter including the subject matter of example 12, wherein the first rotation angle is determined in accordance with a first predetermined relation between the first I-Q data pair and the second I-Q data pair, and the second rotation angle is determined in accordance with a second, different predetermined relation between the first I-Q data pair and the second I-Q data pair.

Example 14 is an I-Q transmitter including the subject matter of examples 12-13, including or omitting elements, wherein the synthesizer circuit further comprises a first digital-to-time converter (DTC) to generate the first phase corrected LO signal and a second DTC to generate the second phase corrected LO signal.

Example 15 is an I-Q transmitter including the subject matter of examples 12-14, including or omitting elements, further comprising a summation circuit configured to generate a final output signal based on the up converted quantized in-phase signal and the up converted quantized quadrature signal.

Example 16 is method for a hybrid polar I-Q transmitter, comprising receiving an in-phase signal and a quadrature signal forming a first I-Q data pair, and generating a quantized in-phase signal and a quantized quadrature signal forming a second I-Q data pair, respectively, based thereon using a quantization circuit; wherein the first and the second I-Q data pairs form a point in an I-Q constellation diagram; determining a first rotation angle and determining a second rotation angle based on the first I-Q data pair and the second I-Q data pair, using a phase correction circuit; generating a first phase corrected local oscillator (LO) signal with a first correction phase added thereto, based on the determined first rotation angle and generating a second phase corrected local oscillator (LO) signal with a second correction phase added thereto, based on the determined second rotation angle using a synthesizer circuit; and up converting the quantized in-phase signal and the quantized quadrature signal based on the first phase corrected LO signal and the second phase corrected LO signal, respectively, using a modulation circuit.

Example 17 is a method including the subject matter of example 16, further comprising processing the quantized in-phase signal and the quantized quadrature signal at a digital to analog converter (DAC) circuit within the modulation circuit, prior to up converting the quantized in-phase signal and the quantized quadrature signal.

Example 18 is a method including the subject matter of examples 16-17, including or omitting elements, wherein generating the quantized in-phase signal and the quantized quadrature signal using the quantization circuit comprises choosing a constellation point corresponding to the second I-Q pair from a predefined set of constellation points in the I-Q constellation diagram defined based on the resolution information of the DAC in the signal path of the quantized in-phase and quadrature signals.

Example 19 is a method including the subject matter of examples 16-18, including or omitting elements, further comprising generating a radio frequency (RF) output signal based on the up converted quantized in-phase signal and the up converted quantized quadrature signal, using a summation circuit.

Example 20 is a method including the subject matter of examples 16-19, including or omitting elements, wherein the first rotation angle corresponds to an angle by which an I-axis of the I-Q constellation diagram is rotated to form a derived I-axis and the second rotation angle corresponds to an angle by which a Q-axis of the I-Q constellation diagram is rotated to form a derived Q-axis, in order to minimize a quantization error associated with the DAC.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A hybrid polar in-phase quadrature (I-Q) transmitter, comprising:
an I-Q quantization circuit configured to,
receive an in-phase signal and a quadrature signal forming a first I-Q data pair, and
generate a quantized in-phase signal and a quantized quadrature signal forming a second I-Q data pair, respectively, based on a resolution information of a digital-to-analog converter (DAC) in a signal path of the quantized in-phase and quadrature signals, wherein the first and second I-Q data pairs form an I-Q constellation point; and
a quantization reduction circuit to minimize a quantization error associated with the DAC, coupled to the I-Q quantization circuit and configured to,
determine a first rotation angle and a second rotation angle based on the first I-Q data pair and the second I-Q data pair; and
generate a radio frequency (RF) output signal based on the first rotation angle and the second rotation angle.

2. The I-Q transmitter of claim 1, wherein the quantization reduction circuit further
comprises a phase correction circuit coupled to the quantization circuit and configured to,
receive the in-phase signal, the quadrature signal, the quantized in-phase signal and the quantized quadrature signal; and
determine the first rotation angle and the second rotation angle based on the in-phase signal, the quadrature signal, the quantized in-phase signal and the quantized quadrature signal.

3. The I-Q transmitter of claim 2, wherein the first rotation angle and the second rotation angle are determined based on a first predetermined relation and a second predetermined relation, respectively, based on the in-phase signal, the quadrature signal, the quantized in-phase signal and the quantized quadrature signal.

4. The I-Q transmitter of claim 3, further comprising a memory circuit configured to store instructions to implement the first predetermined relation and the second predetermined relation.

5. The I-Q transmitter of claim 2, wherein the quantization reduction circuit further
comprises a synthesizer circuit configured to,
receive the first rotation angle and the second rotation angle from the phase correction circuit;
generate a first phase corrected local oscillator (LO) signal with an added first correction phase, wherein the first correction phase corresponds to the first rotation angle; and
generate a second phase corrected local oscillator (LO) signal with an added second correction phase, wherein the second correction phase corresponds to the second rotation angle.

6. The I-Q transmitter of claim 5, wherein the synthesizer circuit further comprises a first digital-to-time converter (DTC) to generate the first phase corrected LO signal and a second DTC to generate the second phase corrected LO signal.

7. The I-Q transmitter of claim 5, wherein the quantization reduction circuit further comprises a first signal path and a second signal path configured to receive the quantized in-phase signal and the quantized quadrature signal, respectively, from the I-Q quantization circuit.

8. The I-Q transmitter of claim 7, wherein the quantization reduction circuit further comprises a modulation circuit configured to apply a first rotation corresponding to the first rotation angle to the quantized in-phase signal and apply a second rotation corresponding to the second rotation angle to the quantized quadrature signal.

9. The I-Q transmitter of claim 8, wherein the modulation circuit further comprises, the DAC, the resolution information of which is used in the I-Q quantization circuit to generate the quantized in-phase signal and the quantized quadrature signal, wherein the DAC comprises a first DAC component located downstream of the first signal path and configured to receive and process the quantized in-phase signal, and a second DAC component located downstream of the second signal path and configured to receive and process the quantized quadrature signal.

10. The I-Q transmitter of claim 9, wherein the modulation circuit further comprises,
a first mixer circuit configured to up convert the processed quantized in-phase signal from the first DAC component based on the first phase corrected LO signal, and
a second mixer circuit configured to up convert the processed quantized quadrature signal from the second DAC component based on the second phase corrected LO signal.

11. The I-Q transmitter of claim 1, wherein the I-Q quantization circuit is configured to generate the quantized in-phase signal and the quantized quadrature signal by choosing a constellation point corresponding to the second I-Q pair from a predefined set of constellation points in an I-Q constellation diagram defined based on the resolution information of the DAC in the signal path of the quantized in-phase and quadrature signals.

12. A hybrid polar in-phase quadrature (I-Q) transmitter, comprising:
a quantization circuit configured to,
receive an in-phase signal and a quadrature signal forming a first I-Q data pair, and generate a quantized in-phase signal and a quantized quadrature signal forming a second I-Q data pair, respectively, based on a resolution information of a digital-to-analog converter (DAC) in a signal path of the quantized in-phase and quadrature signals;
wherein the first and the second I-Q data pairs form a point in an I-Q constellation diagram, and
a phase correction circuit to minimize a quantization error associated with the DAC, coupled to the quantization circuit and configured to,
determine a first rotation angle based on the first I-Q data pair and the second I-Q data pair, and
determine a second rotation angle based on the first I-Q data pair and the second I-Q data pair;
a synthesizer circuit configured to,
generate a first phase corrected local oscillator (LO) signal with an added first correction phase, wherein the first correction phase corresponds to the determined first rotation angle; and
generate a second phase corrected local oscillator (LO) signal with an added second correction phase, wherein the second correction phase corresponds to the determined second rotation angle; and
a modulation circuit configured to,
up convert the quantized in-phase signal based on the first phase corrected LO signal, and
up convert the quantized quadrature signal based on the second phase corrected LO signal.

13. The I-Q transmitter of claim 12, wherein the first rotation angle is determined in accordance with a first predetermined relation between the first I-Q data pair and the second I-Q data pair, and the second rotation angle is determined in accordance with a second, different predetermined relation between the first I-Q data pair and the second I-Q data pair.

14. The I-Q transmitter of claim 12, wherein the synthesizer circuit further comprises a first digital-to-time converter (DTC) to generate the first phase corrected LO signal and a second DTC to generate the second phase corrected LO signal.

15. The I-Q transmitter of claim 12, further comprising a summation circuit configured to generate a final radio frequency (RF) output signal based on the up converted quantized in-phase signal and the up converted quantized quadrature signal.

16. A method for a hybrid polar in-phase quadrature (I-Q) transmitter, comprising:
receiving an in-phase signal and a quadrature signal forming a first I-Q data pair, and generating a quantized in-phase signal and a quantized quadrature signal forming a second I-Q data pair, respectively, based thereon using a quantization circuit;
wherein the first and the second I-Q data pairs form a point in an I-Q constellation diagram;
determining a first rotation angle and determining a second rotation angle based on the first I-Q data pair and the second I-Q data pair, using a phase correction circuit;
generating a first phase corrected local oscillator (LO) signal with an added first correction phase, based on the determined first rotation angle and generating a second phase corrected local oscillator (LO) signal with an added second correction phase, based on the determined second rotation angle using a synthesizer circuit; and
up converting the quantized in-phase signal and the quantized quadrature signal based on the first phase corrected LO signal and the second phase corrected LO signal, respectively, using a modulation circuit.

17. The method of claim 16, further comprising processing the quantized in-phase signal and the quantized quadrature signal at a digital to analog converter (DAC) circuit within the modulation circuit, prior to up converting the quantized in-phase signal and the quantized quadrature signal.

18. The method of claim 16, wherein generating the quantized in-phase signal and the quantized quadrature signal using the quantization circuit comprises choosing a constellation point corresponding to the second I-Q pair from a predefined set of constellation points in the I-Q constellation diagram defined based on a resolution information of a DAC in a signal path of the quantized in-phase and quadrature signals.

19. The method of claim 17, further comprising generating a radio frequency (RF) output signal based on the up converted quantized in-phase signal and the up converted quantized quadrature signal, using a summation circuit.

20. The method of claim 17, wherein the first rotation angle corresponds to an angle by which an I-axis of the I-Q constellation diagram is rotated to form a derived I-axis and the second rotation angle corresponds to an angle by which a Q-axis of the I-Q constellation diagram is rotated to form a derived Q-axis, in order to minimize a quantization error associated with the DAC.

* * * * *